United States Patent [19]
Muraki

[11] Patent Number: 6,005,766
[45] Date of Patent: Dec. 21, 1999

[54] MULTI-LAYERED PRINTED CIRCUIT BOARD AND ITS MANUFACTURING METHOD

[75] Inventor: Yoshitaka Muraki, Tokyo, Japan

[73] Assignee: Nec Corporation, Tokyo, Japan

[21] Appl. No.: 08/651,484

[22] Filed: May 22, 1996

[30] Foreign Application Priority Data

May 24, 1995 [JP] Japan .................................. 7-149411

[51] Int. Cl.⁶ ...................................................... H05K 5/00
[52] U.S. Cl. ........................ 361/679; 361/739; 361/752; 430/14; 428/901
[58] Field of Search ................................. 428/209, 901; 361/679, 736, 748, 739, 752; 430/271.1, 280.1, 275.1, 277.1, 14

[56] References Cited

U.S. PATENT DOCUMENTS

| | | | |
|---|---|---|---|
| 4,582,778 | 4/1986 | Sullivan | 430/277.1 |
| 4,601,972 | 7/1986 | Small, Jr. | 430/280.1 |
| 4,628,022 | 12/1986 | Ors et al. | 430/280.1 |
| 4,930,047 | 5/1990 | Peterson | 361/736 |
| 5,036,432 | 7/1991 | Uronen et al. | 361/679 |
| 5,079,065 | 1/1992 | Masakazu et al. | 428/209 |
| 5,165,984 | 11/1992 | Schoenthaler | 428/209 |
| 5,184,283 | 2/1993 | Hamel | 361/736 |
| 5,268,255 | 12/1993 | Kikuchi et al. | 430/280.1 |
| 5,306,546 | 4/1994 | Schreiber et al. | 428/209 |
| 5,314,788 | 5/1994 | Suzuki et al. | 428/209 |
| 5,387,493 | 2/1995 | Imabayashi et al. | 430/280.1 |
| 5,476,719 | 12/1995 | Sandell et al. | 428/209 |
| 5,541,813 | 7/1996 | Satoh et al. | 361/679 |
| 5,548,485 | 8/1996 | Bethurum et al. | 361/736 |
| 5,568,355 | 10/1996 | Verding et al. | 361/679 |
| 5,703,754 | 12/1997 | Hinze | 361/679 |

FOREIGN PATENT DOCUMENTS

| | | |
|---|---|---|
| 61-64187 | 4/1986 | Japan . |
| 6457653 | 3/1989 | Japan . |
| 362537 | 3/1991 | Japan . |

*Primary Examiner*—Deborah Jones
*Assistant Examiner*—Cathy F. Lam
*Attorney, Agent, or Firm*—Whitham, Curtis & Whitham

[57] ABSTRACT

A multi-layered printed circuit board (PCB) for use in items of portable electronic equipment which use a housing having a convex-concave part and/or a bent part, includes a PCB section having a uniformly thick PCB, and a resin board formed over the PCB in a part matching the internal space of the housing. By installing the multi-layered PCB having such a configuration within the housing, the internal space of the housing can be efficiently utilized.

6 Claims, 5 Drawing Sheets

MULTI-LAYERED PRINTED CIRCUIT BOARD AND ITS MANUFACTURING METHOD

BACKGROUND OF THE INVENTION

The present invention relates to a multi-layered printed circuit board (PCB) for use in various items of electronic equipment, and more particularly to a multi-layered PCB whose shape can be adapted to the housing of electronic equipment whose shape has bent or convex-concave parts and a manufacturing method for such PCBs.

Some of the conventionally used items of electronic equipment, such as portable telephones and handy terminals, have housings whose prescribed parts are thicker elsewhere, convex or concave, or bent. However, flat multi-layered PCBs whose thickness and number of layers are fixed are used in such complexly shaped housings, resulting in the problem that the internal space of such housings has void parts which are not efficiently utilized. There arises another problem that bent and/or concave parts of the box prevent the multi-layered PCB from being thicker than a certain extent, and accordingly restricts the multi-layered wiring and inhibits sufficiently dense packaging of electronic parts.

As a solution to these problems, there is known a configuration in which a plurality of flat multi-layered PCBs are arranged to match the shape of the housing and these PCBs are connected by a flexible PCB. This configuration, however, is complex with an increased number of parts, and accordingly involves the problem of a greater number of manhours spent in its assembly and a correspondingly higher cost.

Meanwhile, examples of concave parts formed in multi-layered PCBs are disclosed in the Gazettes of the Japanese Patents Laid-open No. 62537 of 1991, No. 57653 of 1989 and No. 64187 of 1986. In all these examples, however, the concave parts for mounting electronic elements are machined, resulting in the problem of an increased number of manhours spent in (cost of) manufacturing. None of these examples of the prior art discloses a multi-layered PCB whose configuration is adaptable to the shape of the casing.

SUMMARY OF THE INVENTION

An object of the present invention, therefore, is to provide a multi-layered PCB for use in items of electronic equipment, more particularly portable electronic items, having housings which have bent, concave and/or convex parts, the PCB allowing efficient utilization of the space within the casing, greater freedom of circuit wiring pattern formation and a reduction in the number of manhours spent in the assembly of the electronic item, and to provide a manufacturing method for such PCBs.

In order to achieve this object, a multi-layered PCB according to the invention is to be arranged within a housing whose shape has, for example, bent, concave and/or convex parts, and its thickness varies according to the shape of the space within the housing. This multi-layered PCB has a configuration in which, on either side or both sides of the PCB serving as a substrate, an etchable resin layer and a conductor pattern are formed to match the shape of the space within the housing.

A manufacturing method for the multi-layered PCB comprises (a) a step to form a resin layer or layers on either side or both sides of the PCB constituting a substrate, (b) a step to remove a prescribed part of each of the resin layer or layers by etching, and (c) a step to form a conductor pattern on each of the etched resin layers. Furthermore a step to form another resin layer over each of said layers on which the conductor pattern has been formed, a step to remove by etching a prescribed part of each of the additional resin layers, and a step to form a conductor pattern on each of the etched resin layers can be repeated once or more.

The multi-layered PCB according to the invention, since it allows the internal space of a housing having bent and/or concave-convex parts to be efficiently utilized and permits integrated configuration, can be readily arranged in a housing of the aforementioned shape.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE INVENTION

Figure 1:
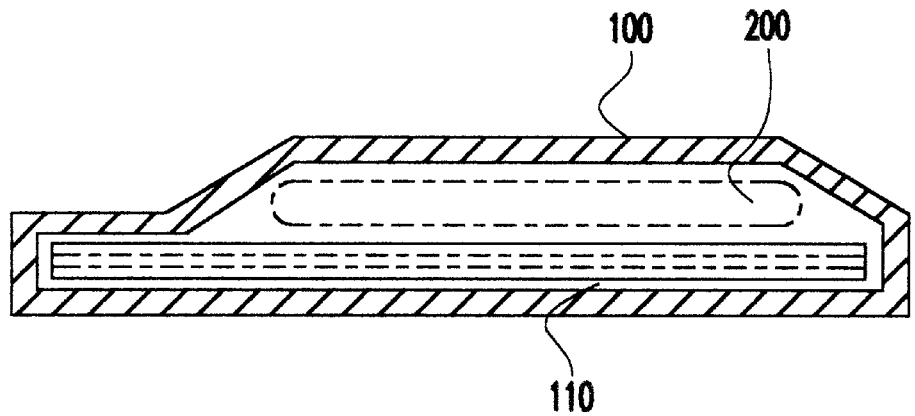
FIG. 1 shows a cross section of a portable electronic unit having a housing with a convex part.
Figure 2:
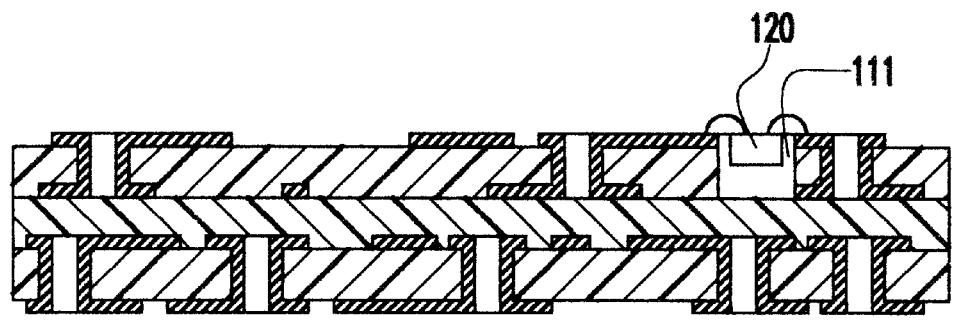
FIG. 2 shows a cross section of a multi-layered PCB used in a portable electronic unit according to the prior art.

First, for the sake of comparison with the present invention, the configuration of a portable electronic unit according to the prior art will be described. FIG. 1 shows a cross section of the portable electronic unit having a housing 100 with a convex part. Within the housing 100 is arranged a multi-layered PCB 110. The multi-layered PCB 110, as illustrated in FIG. 2, is substantially uniform in thickness, consists of resin layers and a wiring pattern, and has concave parts 111 formed and semiconductor elements 120 installed as required.

However, above this board 110, there is an internal space 200 matching the convex part of the housing 100. This internal space 200, in which neither a multi-layered PCB nor electronic elements are formed, is not utilized efficiently.

Figure 3:
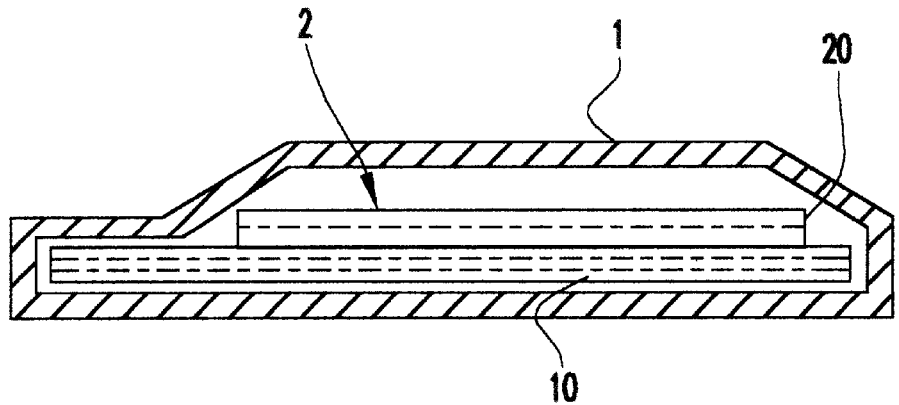
FIG. 3 shows a cross section of an example of a portable electronic unit using a multi-layered PCB according to the invention.
Figure 4:
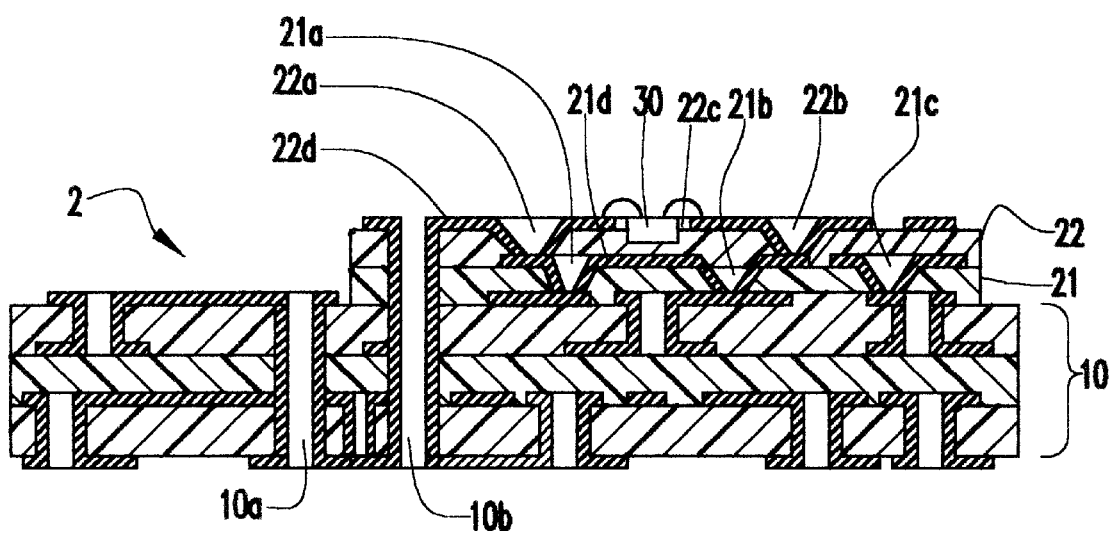
FIG. 4 shows a cross section of an example of a multi-layered PCB according to the invention.

Next, FIG. 3 shows a cross section of a portable electronic unit using a multi-layered PCB according to the present invention. FIG. 4 shows a cross section of an example of the multi-layered PCB according to the invention to be installed in the portable electronic unit of FIG. 3.

As illustrated in FIG. 3, the portable electronic unit is shaped by the housing 1 having a convex part. Within this housing 1 is installed a multi-layered PCB 2 comprising a PCB 10 of a conventionally used type substantially uniform in thickness and a PCB section 20 formed over this PCB 10 in the part matching the convex part of the housing 1. This PCB section 20 is provided with a resin board and a wiring pattern. The internal space of the housing 1 is efficiently utilized by installing the multi-layered PCB 2 of this configuration within the housing 1.

FIG. 4 illustrates a specific example of a multi-layered PCB 2 shown in FIG. 3. Throughholes 10a and viaholes are formed in the four-layered PCB 10 of a conventional configuration consisting of glass epoxy resin layers and a copper wiring pattern. Over this PCB 10 is arranged the PCB section 20 in the position matching the convex part of the housing 1. In this PCB section 20 are formed photosensitive epoxy resin layers 21 and 22 of approximately 40 μm to 80 μm in thickness, which are respectively provided with viaholes 21a, 21b and 21c, viaholes 22a and 22b, and copper wiring circuit patterns 21d and 22d of approximately 15 μm to 20 μm in thickness. In the resin layer 22 is formed a concave part 22c, in which a semiconductor element 30 is installed. There also is formed a throughhole 10b penetrating the multi-layered PCB 2.

Although a two-layered PCB is formed over one face of the four-layered uniform PCB 10 in the example of FIG. 4, it is also possible to form a four to eight-layered PCB according to the internal shape of the housing. It is possible, too, to form the PCB 20 on each of the two sides of the PCB 10. The resin layers 21 and 22 may consist of photosensitive resin, such as acrylic resin.

The multi-layer PCB 2 can efficiently utilize the internal space of the housing 1. Since the board 2 can mount all the required electronic circuits for the electronic unit in which it is installed, it can contribute to reducing the number of required components, resulting in easier assembly and a smaller number of manhours spent in the manufacturing process.

Next will be described a manufacturing process for the multi-layered PCB according to the invention.

Figure 5A:
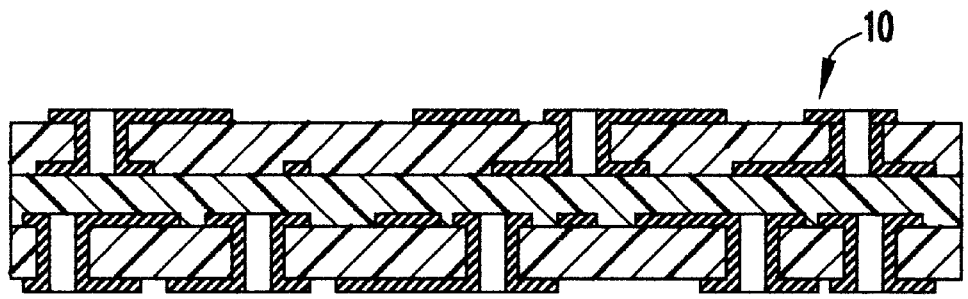
FIGS. 5A through 5C illustrate an example of a multi-layered PCB manufacturing process according to the invention.

(1) First, a PCB 10 to serve as substrate is prepared as illustrated in FIG. 5A. On this board 10, a required wiring pattern should be formed of glass epoxy resin layers and a copper wiring pattern in advance by a known method.

Figure 5B:
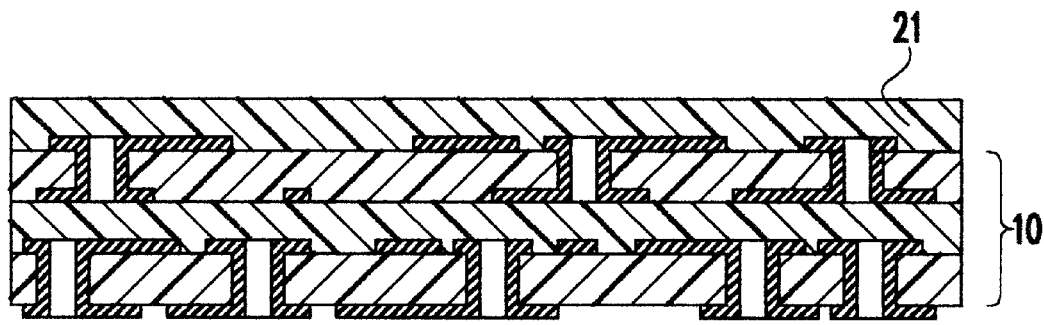

(2) As shown in FIG. 5B, the whole surface of this board 10 is coated with photosensitive epoxy resin 21 by using a curtain coater. The coat thickness is adjusted to be between approximately 40 μm and 80 μm when the circuit is printed over the board.

(3) The whole surface of the photosensitive epoxy resin 21 is coated with etching resist, of which the parts in which viaholes 21a, 21b and 21c are to be formed and parts 20a and 20b in which no resin layer 21 is to be formed are further covered with a pattern film, followed by exposure and development.

(4) Then, the viaholes 21a, 21b and 21c are formed in the resin layer 21 by etching, and the parts 20a and 20b are removed.

(5) After that, the resin layer 21 is dried and hardened.

(6) This resin layer 21 is further plated with copper in a thickness of approximately 15 μm to 20 μm.

(7) Etching resist is formed over the copper plating, and a pattern film to intercept the part to constitute a copper wiring circuit pattern 21d from light is formed over the etching resist, followed by exposure and development.

Figure 5C:
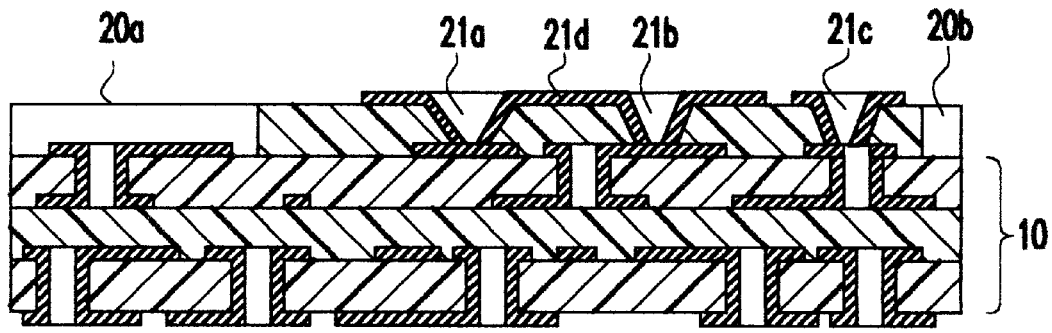

(8) The copper wiring circuit pattern 21d is formed over the resin layer 21 by etching (FIG. 5C).

Figure 6A:
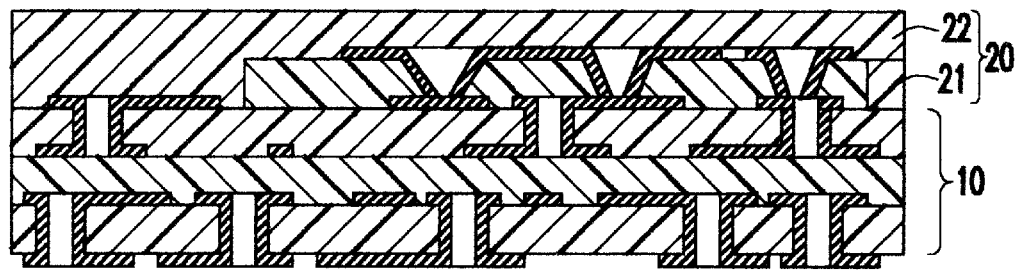
FIGS. 6A through 6C illustrate another example of the multi-layered PCB manufacturing process according to the invention.

(9) Next, as illustrated in FIG. 6A, a photosensitive epoxy resin layer 22 is formed over the PCB 10 and the resin layer 21 by the above-described method.

(10) Etching resist is formed all over the resin layer 22, and the parts in which viaholes 22a and 22b and a concave part 22c are to be formed and parts 20a and 20b in which no resin layer 22 is to be formed are further covered with a pattern film, followed by exposure and development.

(11) Then, the viaholes 22a and 22b and the concave part 22c are formed in the resin layer 22 by etching, and the parts 20a and 20b are removed.

(12) After that, the resin layer 22 is dried and hardened.

(13) This resin layer 22 is further plated with copper in a thickness of approximately 15 μm to 20 μm as in the previous case.

(14) Etching resist is formed over the copper plating, and a pattern film to intercept the part to constitute a copper wiring circuit pattern 22d from light is formed over the etching resist, followed by exposure and development.

Figure 6B:
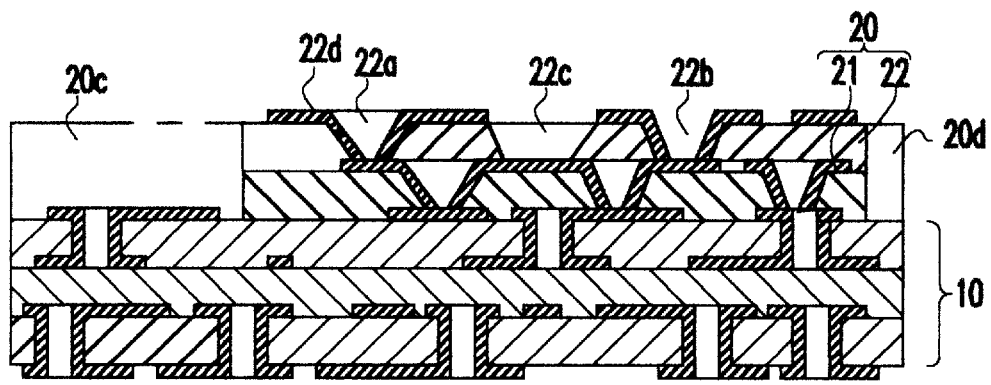

(15) The copper wiring circuit pattern 22d is formed over the resin layer 22 by etching (FIG. 6B).

Figure 6C:
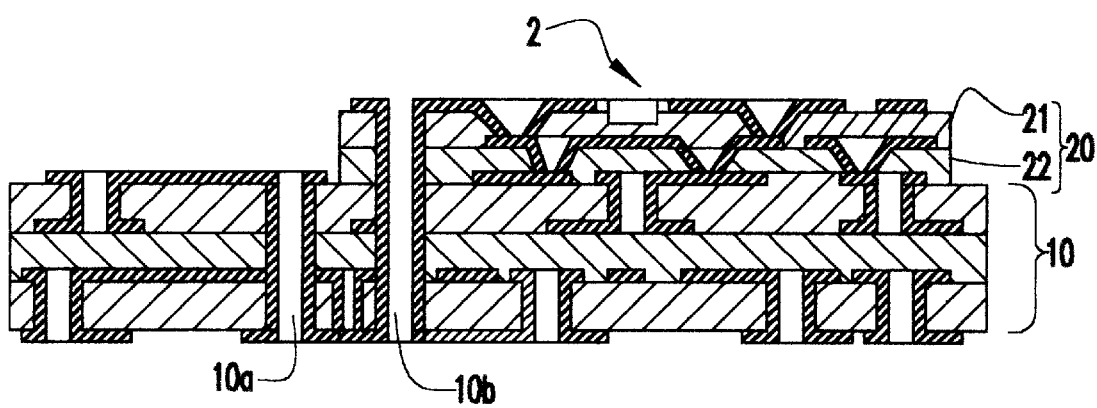

(16) After that, throughholes 10a and 10b are drilled in prescribed positions, followed by copper formation within these throughholes by electroless copper plating (FIG. 6C).

By the foregoing process, the PCB 20 can be formed over the PCB 10, and specific parts, such as 20a and 20b, can be removed. As the multi-layered PCB 2 can be accordingly formed to match the shape of the internal space of the housing, this space can be efficiently utilized.

According to the prior art, the concave part of a multi-layered PCB in which to accommodate semiconductor elements or the like is formed by machining. In the process according to the present invention, by contrast, the concave part 22c is etched together with the viaholes 22a and 22b. As a result, the number of manhours spent in the manufacture can be less than in PCB production by the prior art.

Figure 7:
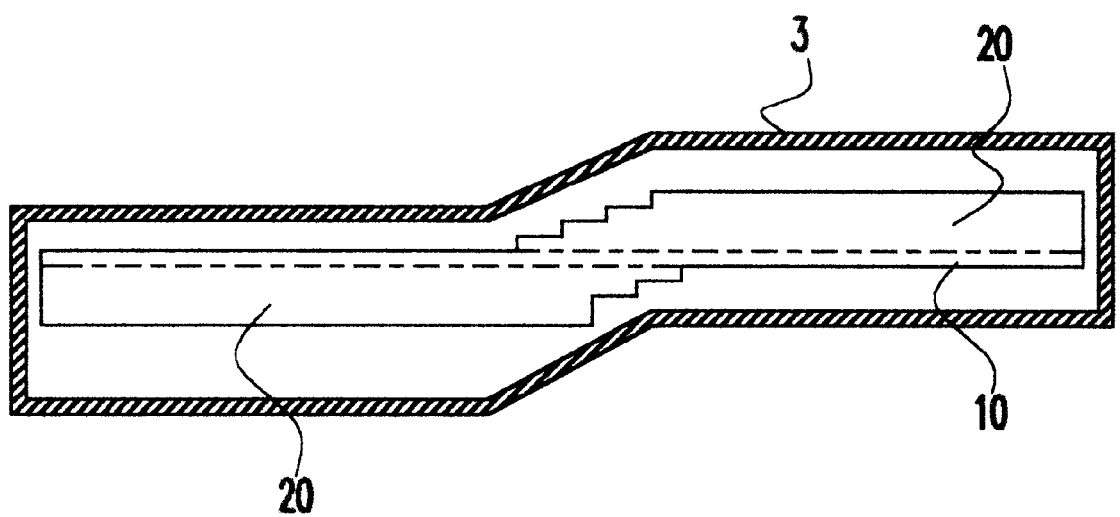
FIG. 7 shows a cross section of another example of a portable electronic unit using a multi-layered PCB according to the invention.

The shape of a multi-layered PCB according to the invention is not restricted to what is shown in FIG. 4. For example, for a multi-layered PCB for installation in a housing 3 shown in FIG. 7, a resin board 20 can be formed over each of the two sides of the PCB 10 which is to constitute the substrate to match the internal shape of the housing 3.

While the present invention has been described with reference to certain preferred embodiments thereof, it is to be understood that the subject matter encompassed by the invention is not limited to these specific embodiments. Instead, it is intended to include all such alternatives, modifications and equivalents as fall within the spirit and scope of the following claims.

What is claimed is:

1. A portable electronic unit, comprising:
    a housing having one of a convex-concave portion and a bent portion; and
    a multilayer printed circuit board (PCB) installed within said housing,
    wherein said PCB comprises a PCB having a substantially uniform thickness and a PCB section formed over said PCB in an area matching said one of said convex-concave portion and said bent portion of said housing, said PCB section being provided with a resin board and a wiring pattern.

2. The port able electronic unit, as claimed in claim 1, wherein throughholes are formed through said multi-layered PCB,
    wherein said PCB has a thickness which substantially conforms to the shape of the space within said housing such that the housing is substantially devoid of empty space, wherein the housing is designed and formed in advance before the board is formed, wherein said PCB includes first and second sides, and wherein an etchable resin layer or layers and a conductor pattern or patterns are formed on at least one of said first and second sides of the PCB serving as a substrate, wherein said etchable resin layer or layers each comprise a chemically etchable photosensitive resin layer or layers, and said conductor pattern or patterns are formed by chemical etching, said chemically etchable photosensitive resin layer or layers each forming an insulating layer on said PCB, and thickness and shape of said PCB being selectively varied to conform to a predetermined shape of the space within the housing.

3. A portable electronic unit, comprising:

a housing having a bent, concave, or convex region; and a multilayer printed circuit board (PCB) positioned within said housing, said multilayer PCB having a bent, concave, or convex region which fits within and matches said contoured region of said housing.

4. The portable electronic unit of claim 3, wherein said bent, concave or convex region of said housing and said bent, concave or convex region of said multilayered PCB are both concave.

5. The portable electronic unit of claim 3 wherein said bent, concave or convex region of said housing and said bent, concave or convex region of said multilayered PCB are both convex.

6. The portable electronic unit of claim 3 further comprising an electrically conductive via extending between at least two different layers of said multilayered PCB.

* * * * *